United States Patent
Urashima et al.

(10) Patent No.: US 7,652,299 B2
(45) Date of Patent: Jan. 26, 2010

(54) NITRIDE SEMICONDUCTOR LIGHT-EMITTING DEVICE AND METHOD FOR FABRICATION THEREOF

(75) Inventors: Yasuhito Urashima, Ichihara (JP); Katsuki Kusunoki, Ichihara (JP)

(73) Assignee: Showa Denko K.K., Tokyo (JP)

( * ) Notice: Subject to any disclaimer, the term of this patent is extended or adjusted under 35 U.S.C. 154(b) by 113 days.

(21) Appl. No.: 11/352,336

(22) Filed: Feb. 13, 2006

(65) Prior Publication Data

US 2006/0192247 A1    Aug. 31, 2006

Related U.S. Application Data

(60) Provisional application No. 60/654,002, filed on Feb. 18, 2005.

(30) Foreign Application Priority Data

Feb. 14, 2005    (JP) ............................ 2005-035935

(51) Int. Cl.
    *H01L 33/00*    (2006.01)
(52) U.S. Cl. ............... 257/95; 257/98; 257/E33.025; 257/E33.034; 257/E33.068; 438/29
(58) Field of Classification Search ............... 257/98, 257/E33.025, E33.028, E33.033, E33.034, 257/94, 95, E33.068; 438/29
    See application file for complete search history.

(56) References Cited

U.S. PATENT DOCUMENTS

| | | | | |
|---|---|---|---|---|
| 5,696,389 | A * | 12/1997 | Ishikawa et al. | 257/99 |
| 5,869,848 | A * | 2/1999 | Nobori et al. | 257/95 |
| 5,889,295 | A * | 3/1999 | Rennie et al. | 257/96 |
| 6,121,636 | A * | 9/2000 | Morita et al. | 257/99 |
| 6,232,623 | B1 * | 5/2001 | Morita | 257/103 |
| 6,274,891 | B1 * | 8/2001 | Tanaka et al. | 257/99 |
| 6,518,598 | B1 * | 2/2003 | Chen | 257/91 |
| 6,657,236 | B1 * | 12/2003 | Thibeault et al. | 257/98 |

(Continued)

FOREIGN PATENT DOCUMENTS

JP    4-297023    10/1992

(Continued)

OTHER PUBLICATIONS

Iwata et al., "Gas Source Molecular Beam Epitaxy Growth of GaN", Jpn. J. Appl. Phys., vol. 36 (1997), pp. L661-L664.*

*Primary Examiner*—Anh Phung
*Assistant Examiner*—Michael Lulis
(74) *Attorney, Agent, or Firm*—Sughrue Mion, PLLC

(57) ABSTRACT

A nitride semiconductor light-emitting device includes a substrate and a nitride semiconductor layer including a light-emitting layer stacked on the substrate, wherein a normal line relative to a lateral face of the nitride semiconductor layer is not perpendicular to a normal line relative to a principal plane of the substrate. A method for the production of a nitride semiconductor light-emitting device that includes a substrate and a nitride semiconductor layer including a light-emitting layer stacked on the substrate includes the steps of covering a first surface of the nitride semiconductor layer with a mask provided with a prescribed pattern, removing the nitride semiconductor layer in regions to be divided into component devices till the substrate, subjecting the nitride semiconductor layer to wet-etching treatment and dividing the nitride semiconductor layer into the component devices.

20 Claims, 2 Drawing Sheets

U.S. PATENT DOCUMENTS

| | | | |
|---|---|---|---|
| 6,724,068 B2* | 4/2004 | Matsuyama | 257/618 |
| 6,809,340 B2* | 10/2004 | Kato et al. | 257/79 |
| 6,844,572 B2* | 1/2005 | Sawaki et al. | 257/94 |
| 7,473,934 B2* | 1/2009 | Nagai et al. | 257/89 |
| 2001/0030328 A1* | 10/2001 | Ishida | 257/103 |
| 2003/0062529 A1* | 4/2003 | Kato et al. | 257/79 |
| 2004/0026710 A1* | 2/2004 | Tsuda et al. | 257/103 |
| 2004/0266043 A1* | 12/2004 | Oohata et al. | 438/46 |
| 2006/0071225 A1* | 4/2006 | Beeson et al. | 257/98 |
| 2006/0108598 A1* | 5/2006 | Lai et al. | 257/103 |
| 2006/0231852 A1* | 10/2006 | Kususe et al. | 257/99 |
| 2006/0273336 A1* | 12/2006 | Fujikura et al. | 257/98 |
| 2008/0191226 A1* | 8/2008 | Urashima | 257/98 |
| 2009/0212319 A1* | 8/2009 | Muraki et al. | 257/103 |

FOREIGN PATENT DOCUMENTS

| | | |
|---|---|---|
| JP | 2784537 | 5/1998 |
| JP | 10-190152 | 7/1998 |
| JP | 2836687 | 10/1998 |
| JP | 3026087 | 1/2000 |
| JP | 2000-68608 | 3/2000 |
| JP | 2002-203815 A | 7/2002 |
| JP | 2003-243302 | 8/2003 |
| TW | 533547 | 1/1991 |
| WO | WO 2007034971 A1 * | 3/2007 |
| WO | WO 2008059904 A1 * | 5/2008 |

* cited by examiner

NITRIDE SEMICONDUCTOR LIGHT-EMITTING DEVICE AND METHOD FOR FABRICATION THEREOF

CROSS-REFERENCE TO RELATED APPLICATIONS

This application claims benefit from Provisional Application No. 60/654,002 filed Feb. 18, 2005, incorporated herein by reference.

BACKGROUND OF THE INVENTION

1. Field of the Invention

This invention relates to a Group III nitride semiconductor light-emitting device and particularly to a Group III nitride semiconductor light-emitting device which has enhanced the light-extraction efficiency thereof.

2. Description of the Prior Art

The Group III nitride semiconductors (hereinafter abbreviated as "nitride semiconductors") possess a band gap of a direct transition type of energy corresponding to the visible light through the ultraviolet light region and permit highly efficient light emission and have been consequently reduced to commercial products, such as light-emitting diodes (LEDs) and laser diodes (LDs). Particularly, the realization of white light-emitting diodes due to their combination with fluorescent materials has been expected as a new field for the application of light-emitting diodes.

The output of a light-emitting diode is determined by the product of the internal quantum efficiency having an epitaxial structure or crystallinity, for example, relate thereto multiplied by the light-extraction efficiency having the resorption in the device or shape of the device relate thereto. Among other factors mentioned above, the resorption in the device which affects the light-extraction efficiency arises while the light is repeating collision on a substrate which is impervious to the emitted light or transmission through a light-emitting layer. The total reflection on the surface of the device constitutes itself one factor that has a great effect on the light-extraction construction. It is well known that when a light is advancing from a layer of a large refractivity to a layer of a small refractivity, the part of the light exceeding the critical angle ($\theta c$) undergoes total reflection in the interface and no light is extracted to the layer of the small refractivity. In the case of gallium nitride (GaN), for example, since it has a refractivity of 2.4, only the light that enters the escape cone having an apex angle of 24° relative to the direction perpendicular to the surface is extracted to the exterior.

This ratio is 27%. Owing to this effect, therefore, the light-extraction efficiency is greatly restrained. As means to avoid this restraint imposed by the total reflection in the interface on the light-extraction, a method for coarsening the interface (refer, for example, to Japanese Patent No. 2836687) and a method for forking the shape of the device to utilize the escape cone of another surface (refer, for example, to Japanese Patent No 2784537) have been known. For the growth of a nitride semiconductor, the MOCVD (metal-organic chemical vapor deposition) method is predominantly used. The MOCVD method is a method for growing a nitride semiconductor by causing an organic metal to react with a nitrogen source on a substrate. The single crystal of a nitride semiconductor, however, has not yet been produced on a commercial scale. Though the pseudo single crystal substrate obtained by effecting the thick-film epitaxial growth on an Si or GaAs substrate by the HVPE (hydride vapor phase epitaxy) method has been already available in the market, it is extremely expensive. As the substrate for the light emitting diode, therefore, generally a heterogeneous substrate, such as a sapphire ($Al_2O_3$) or silicon carbide (SiC) substrate which is stable at high temperature is used.

The sapphire and the SiC as stable substances, however, are known also as substances which are so hard as to allow no easy processing. Consequently, they entail the problem that the process of dividing them into component devices with the object of enhancing the light-extraction efficiency will be rendered difficult. When this division is effected by the mechanical method of dicing, the component devices consequently obtained sustain chippings and cracking so frequently as to render the enhancement of yield difficult to attain. When the division is effected by such means of dry etching as resorts to no mechanical process, it consumes a long time and consequently incurs a serious degradation of productivity.

The mechanical method which resorts to a dicing process is known to form on the processed surface a layer called a shattered layer which interferes with the light-extraction process and, the dry etching as well is known to suffer the electrical and optical properties of the surface to be affected by the exposure to the high energy particles of plasma. The wet etching as a processing method of insignificant damage has been also known (refer, for example, to JP-A HEI 10-190152 and JP-A 2000-68608). The component devices produced by this method, however, have perpendicular sections of division.

This invention, in view of such problems as the decline of the light-extraction efficiency due to the total reflection of light by the nitride semiconductor light emitting device and the decline of the light-extraction efficiency by the shattered layer generated during the mechanical processing method performed on the substrate difficult to process, is aimed at enhancing the light-extraction efficiency of the nitride semiconductor light-emitting device.

This invention has been based on the discovery that the light-extraction efficiency is enhanced by utilizing as a processing means the wet etching process incapable of causing any significance damage, tilting the lateral face of the semiconductor layer in the nitride semiconductor device and utilizing this face as well for the purpose of extracting light.

SUMMARY OF THE INVENTION

The present invention provides as the first aspect thereof a nitride semiconductor light-emitting device comprising a substrate and a nitride semiconductor layer including a light-emitting layer stacked on the substrate, wherein a normal line relative to at least a lateral face of the nitride semiconductor layer between the substrate and the light-emitting layer and a normal line relative to a surface of the nitride semiconductor layer form an angle $\theta$ larger than 90 degrees.

In the second aspect of the invention that includes the first aspect, the lateral face of the nitride semiconductor layer excludes the light-emitting layer.

In the third aspect of the invention that includes the first or second aspect, the nitride semiconductor layer has a lateral face between itself and the light-emitting layer made perpendicular.

In the fourth aspect of the invention that includes the first aspect, the angle $\theta$ is 95 degrees or more and 170 degrees or less.

In the fifth aspect of the invention that includes the first aspect, the angle $\theta$ is 100 degrees or more and 160 degrees or less.

In the sixth aspect of the invention that includes the second aspect, the nitride semiconductor layer has a thickness in a range of 1 to 20 μm.

In the seventh aspect of the invention that includes any one of the first to sixth aspects, the substrate is formed of sapphire.

In the eighth aspect of the invention that includes any one of the first to sixth aspects, the substrate is formed of silicon carbide.

In the ninth aspect of the invention that includes any one of the first to eighth aspects, the nitride semiconductor layer has a surface having a (0001) face as a principal face.

The present invention further provides as the tenth aspect thereof a method for the production of a nitride semiconductor light-emitting device that comprises a substrate and a nitride semiconductor layer including a light-emitting layer stacked on the substrate, comprising the steps of covering a first surface of the nitride semiconductor layer with a mask provided with a prescribed pattern, removing the nitride semiconductor layer in regions to be divided into component devices till the substrate, subjecting the nitride semiconductor layer to wet-etching treatment and dividing the nitride semiconductor layer into the component devices.

In the eleventh aspect of the invention that includes the tenth aspect, the substrate is formed of sapphire.

In the twelfth aspect of the invention that includes the tenth aspect, the substrate is formed of silicon carbide.

In the thirteenth aspect of the invention that includes any one of the tenth to twelfth aspects, the mask is a photoresist.

In the fourteenth aspect of the invention that includes any one of the tenth to thirteenth aspects, the step of removing the nitride semiconductor layer is performed by means of a laser.

In the fifteenth aspect of the invention that includes any one of the tenth to thirteenth aspects, the step of removing the nitride semiconductor layer is performed by means of dry etching.

In the sixteenth aspect of the invention that includes any one of the tenth to thirteenth aspects, the step of removing the nitride semiconductor layer is performed by means of a dicer.

In the seventeenth aspect of the invention that includes any one of the tenth to sixteenth aspects, the wet etching treatment is performed by use of orthophosphoric acid.

This invention, by tilting the lateral face of the semiconductor layer of the nitride semiconductor device, is enabled to add to the amount of the light transmitted through the lateral face or the light reflected on the lateral face and eventually extracted through the nitride semiconductor device layer to the exterior and consequently add to the light-extraction efficiency. It is further enabled, by processing the lateral face of the nitride semiconductor device on the substrate hard to process by means of wet etching to obtain a device sustaining no significant damage.

The above and other objects, characteristic features and advantages of the present invention will become apparent to those skilled in the art from the description given herein below with reference to the accompanying drawings.

DESCRIPTION OF THE PREFERRED EMBODIMENT

This invention concerns a nitride semiconductor device containing a light emitting layer stacked on a substrate, in which the normal line relative to the lateral face of the nitride semiconductor layer forms angle θ larger than 90 degrees (hereinafter referred to as "is tilted") to the normal line relative to the surface of the nitride semiconductor layer.

Figure 1:
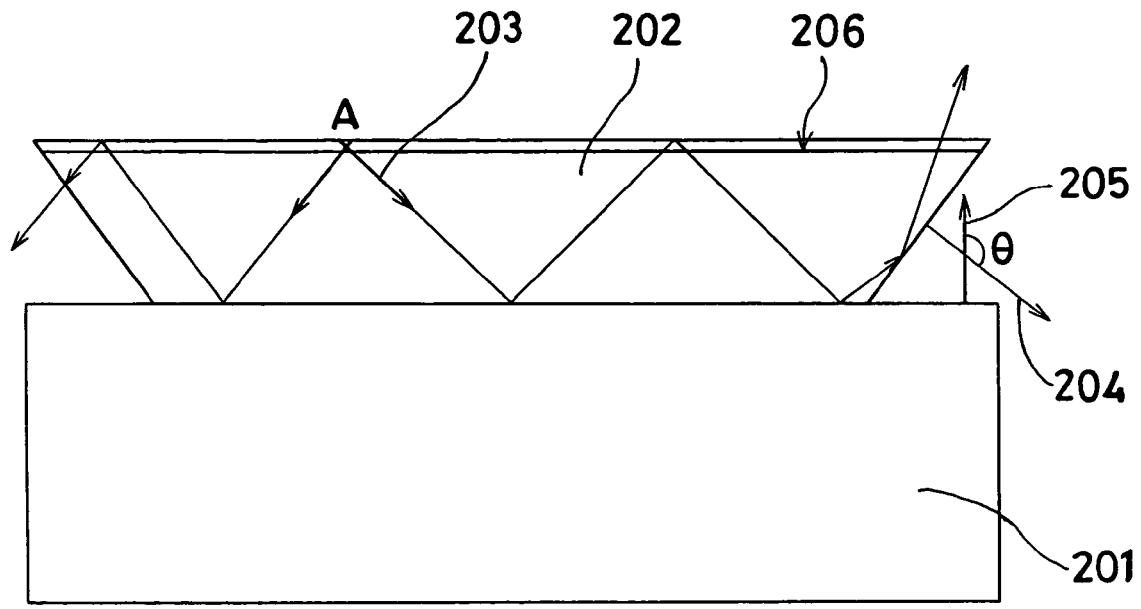
FIG. 1 is a schematic cross-sectional view illustrating one example of the advance of light in a nitride semiconductor device contemplated by this invention, and Fig.
Figure 2:
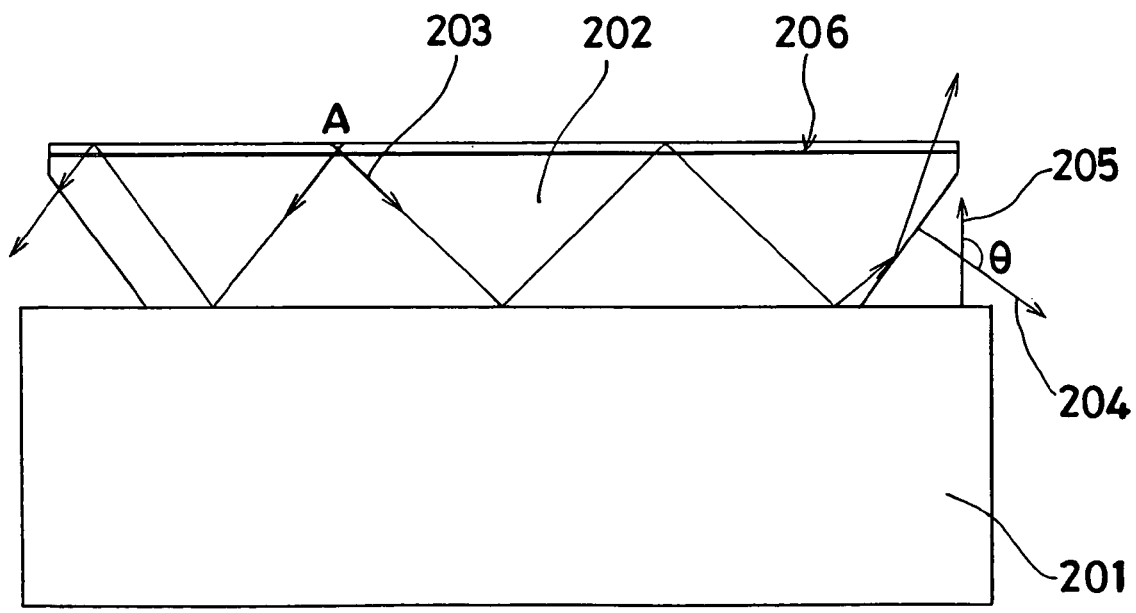
FIG. 2 is a schematic cross-sectional view illustrating a lateral face between the nitride semiconductor layer and the light-emitting layer made perpendicular.

Now, this invention will be specifically explained below with reference to the accompanying drawings. FIG. 1 is a schematic cross-sectional view illustrating one example of the advance of light in a nitride semiconductor device of this invention, depicting the case of having the lateral face of a semiconductor layer 202 tilted toward the outside relative to the principal plane of a substrate 201. FIG. 2 is a schematic cross-sectional view in which a lateral face between the nitride semiconductor layer and the light-emitting layer is made perpendicular. In these diagrams, reference numeral 203 denotes an arrow line indicating the direction of advance of light, numeral 204 denotes the normal line relative to the lateral face of the semiconductor layer, numeral 205 denotes the normal line relative to the principal plane of the substrate and symbol θ denotes the angle defined by these normal lines. Since the present invention adopts the device structures in each of which the light-emitting layer is disposed in the vicinity of the first surface of the device, the configuration shown in FIG. 2 is superior in processing uniformity of the lateral face of the light-emitting layer to the configuration shown in FIG. 1. For this reason, the configuration shown in FIG. 2 has the effects of stable light emission and high luminance.

Figure 3:
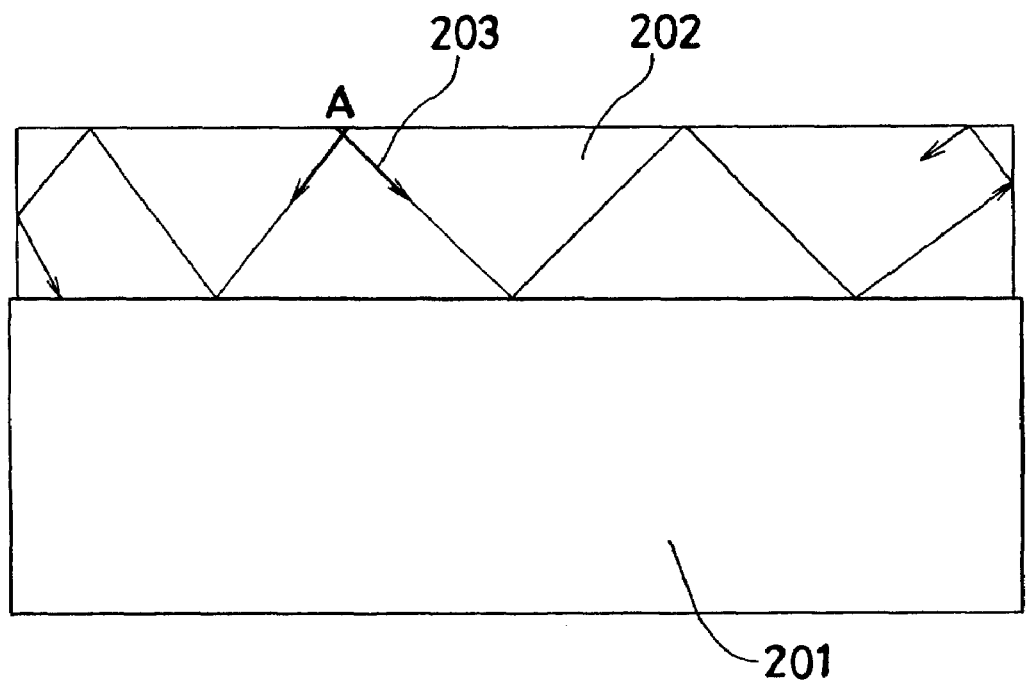
FIG. 3 is a schematic cross-sectional view illustrating one example of the advance of light in a conventional nitride semiconductor device.

FIG. 3 is a schematic cross-sectional view illustrating one example of the advance of light in a conventional nitride semiconductor device, depicting the case of having the lateral face of the semiconductor layer 202 laid perpendicularly to the principal plane of the substrate 201.

Though the reason for the enhancement of the light-extraction efficiency obtained in this invention by the tilt of the lateral face of the semiconductor layer relative to the principal plane of the substrate may be logically explained by the following supposition. FIG. 3 illustrates the conventional nitride semiconductor. When the light emitted at the point A advances like the arrow line and the light impinging on the lateral face of the semiconductor exceeds the critical angle, this light is reflected at the point of incidence and is further reflected on the interface between the semiconductor layer and the substrate. As a result, the light-extraction efficiency is lowered.

In the case depicted in FIG. 1, while the light is reflected on the lateral face of the semiconductor layer, the light falls within the critical angle on the interface between the semiconductor layer and the substrate and therefore is transmitted through this interface and eventually extracted out of the device. In FIG. 1, the tilted angle θ is larger than 90 degrees and smaller than 180 degrees. It is preferably 95 degrees or more and 170 degrees or less and more preferably 100 degrees or more and 160 degrees or less.

Since the incident light on the lateral face of the semiconductor of FIG. 1 falls within the critical angle, it is transmitted through the semiconductor layer.

Though the nitride semiconductor is generally grown on the heterogenous substrate, the nitride semiconductor and the heterogenous substrate have different refractive indexes.

When the light is propagated within a layered body, therefore, the perpendicular end face returns the light into the body because of the reflection on the end face. The end face which constitutes a tilted surface as in the case of this invention varies the direction of advance of light and contributes to the extraction of light through another surface.

In this invention, the lateral faces of the nitride semiconductor layer and the substrate which lie in the same direction are preferred not to form a continuous face. In this invention, the light is concentrated within the nitride semiconductor layer. When an empty space occurs in the outer side part of the joint surface between the nitride semiconductor and the substrate as illustrated in FIG. 1, the change of refractivity increases in this portion and tends to return the light toward the light-emitting surface side.

The tilted surface is preferably formed by wet etching using orthophosphoric acid. Since the wet etching gives rise to a heat balance reaction, no damage will be imparted to a crystal, and there is no possibility of the transparency of the crystal being deteriorated.

When a nitride semiconductor layer having the surface thereof mainly comprising a (0001) face is subjected to wet etching using orthophosphoric acid, while a facet face equivalent to the (1-10-1) plane tilted relative to the surface is easy to develop on the lateral face, the facet face is flat from the standpoint of the atomic level and brings about high reflectivity.

For the substrate of the nitride semiconductor light-emitting device of this invention, various known substrate materials including oxide single crystals, such as sapphire single crystal ($Al_2O_3$; A plane, C plane, M plane and R plane) and spinel single crystal ($MgAl_2O_4$), and SiC single crystal can be used without any restriction. Among other substrate materials numerated above, the sapphire single crystal or the SiC single crystal proves particularly advantageous. Incidentally, the plane orientations of the substrate are not particularly restricted. The substrate to be used may be a just substrate or a substrate provided with an off angle.

For the purpose of stacking the gallium nitride-based compound semiconductor on the substrate, the low temperature buffer method disclosed in Japanese Patent No. 3026087 and JP-A HEI 4-297023 and the lattice mismatch crystal epitaxial growth technique called the Seeding Process (SP) and disclosed in JP-A 2003-243302 can be used.

When the low temperature buffer method or the lattice mismatch crystal epitaxial growth technique, such as the SP, is used, the gallium nitride-based compound semiconductor which is stacked as the under layer on the substrate is preferred to be in an undoped form or a GaN doped to such a low degree as $5 \times 10^{17}$ $cm^{-3}$. The thickness of the under layer is preferably in the range of 1 to 20 μm and more preferably in the range of 5 to 15 μm. On the under layer, n-type GaN is grown to contact the electrode and supply it with an electric current. During the growth of n-type GaN, the growing layer is supplied with an n-type dopant till a dosage in the range of $1 \times 10^{18}$ $cm^{-3}$ to $1 \times 10^{19}$ $cm^{-3}$. As the n-type dopant, generally Si or Ge is selected. The doping is known in two types, a structure resulting from uniform doping and a structure resulting from periodically repeating a low dope layer and a high dope layer. Particularly, the latter intermittent doping is effective in suppressing the occurrence of pits in the growing crystal.

An n clad layer is preferably interposed between a contact layer and a light-emitting layer. The n clad layer can be formed of AlGaN, GaN or InGaN, for example. When it is formed of InGaN, it goes without saying that the layer is preferably in a composition having a larger band gap than the InGaN of an active layer. The carrier concentration of the n clad layer may be the same as or may be larger or smaller than that of the n contact layer. The light-emitting layer on the clad layer is preferably in a quantum well structure. This structure may be either the simple quantum well structure having only one well layer or the multiple quantum well structure having a plurality of well layers. Particularly, the multiple quantum well structure proves advantageous because it is capable of combining high output and low operation voltage as the structure of a device using a Group III gallium nitride-based compound semiconductor. Incidentally, in the case of the multiple quantum well structure, the whole of well layers (active layers) and barrier layers will be collectively referred to in the present specification as a light-emitting layer.

The p-type layer generally has a thickness in the range of 0.01 to 1 μm and is formed of a p clad layer contiguous to an active layer and a p contact layer intended to form a positive electrode. The p clad layer is formed of GaN or AlGaN, for example, and is doped with Mg as a p dopant. The negative electrode is well known in various compositions and structures. These well known negative electrodes may be used without any restriction. As the contacting materials for the negative electrode fated to contact the n contact layer, not only Al, Ti, Ni and Au but also Cr, W and V are available. It goes without saying that the whole negative electrode may be formed in a multilayer structure and may be provided with a bonding property. Particularly, the coating of the outermost surface with Au is at an advantage in facilitating the bonding.

The positive electrode as well is well known in various compositions and various structures. These well-known positive electrodes may be used without any restriction. The transparent positive electrode material may contain Pt, Pd, Au, Cr, Ni, Cu and Co, for example. Further, it is known that the positive electrode formed in a partially oxidized structure enhances the perviousness of the electrode to light. As the reflecting type positive electrode materials, Rh, Ag and Al may be used besides the materials enumerated above.

For the purpose of tilting the lateral faces of the semiconductor layers of the individual devices obtained by dividing the nitride semiconductor, a resist pattern is first formed so as to cover the p electrode, the n electrode and the exposed p-type layer. The resist may be in the positive type or the negative type. The lithography is performed on the individual devices in accordance with the popular procedure using a photo mask which has a proper pattern for exposing the boundaries of the individual devices including the p electrodes and the n electrodes. The lithography is not always necessary when the resist is capable of covering the electrodes and the p-type layers mentioned above and enabling the individual devices to be discriminated. The thickness of the film is preferably in the range of 0.1 μm to 20 μm. If the film thickness is unduly small, the shortage will possibly suffer the film to peel off during the course of the wet etching. If it is unduly large, the overage will possible render resolution of lithograph difficult and allow no easy recognition of the underlying pattern. The film thickness is advantageously in the range of 0.5 μm to 10 μm and more advantageously in the range of 1 μm to 5 μm.

The removal of the nitride semiconductor layer till the substrate is preferably carried out by means of a laser. Any type of laser processing machine can be used in the present invention insofar as it can form expanding slots capable of dividing a semiconductor wafer into individual chips. Specifically, there can be used a $CO_2$ laser, YAG laser, excimer laser and pulsed laser capable of forming separation grooves of the shape of a continuous line, dotted line and subsidiary fracture. Among other lasers enumerated above, the pulsed laser is preferred.

The wavelength of the laser can be used in the range of 193 nm to 1064 nm. By selecting a laser of a preferable wavelength of 266 nm or 355 nm smaller than the absorption terminal of the nitride semiconductor, it is made possible to limit the position of processing to the position irradiated with the laser because the absorption coefficient of the nitride semiconductor is so high as to reach $10^5$ cm$^{-1}$. The frequency thereof is preferably in the range of 1 Hz to 100000 Hz, more preferably 30000 Hz to 70000 Hz. The laser output is preferred to be minimal. Since the excess laser output gives heat damage to a substrate or compound semiconductor, the output is preferably 2 W or less, more preferably 1 W or less.

The spot shape of the laser beams irradiated is circular, elliptical or substantially rectangular. The elliptical shape rather than the circular shape is preferred. Particularly in the case of the elliptical shape, it is better to adjust the shape to be elongated in the processing direction. This adjustment enables the cut surface to be made clearer than in the case of the circular shape and the processing speed to be enhanced. In the case of the circular shape, the diameter thereof is preferably in the range of 0.1 to 20 μm, particularly preferably 10 μm or less. The beam length is preferably 10 μm or more, more preferably 20 μm or more. By properly selecting the optical system for the laser, it is made possible to implement the process in a width smaller than 10 μm and enhance the yield of the devices.

The depth of the laser processing may be arbitrarily selected within the range of 1 μm or more. If the processing depth is unduly small, the shortage will possibly result in deforming the divided devices. When forming the expanding slots from the compound semiconductor layer, the deformation of the divided devices is suppressed if the depth of the expanding slots in the substrate is 5 μm or more. The depth of 10 μm or more proves further advantageous.

While the sectioned shape of the expanding slots may be any of a square, U-letter, V-letter, etc., the V-letter shape is preferable because a crack is generated from the neighborhood of the tip of the V-letter shape when dividing the device into chips to enable a substantially perpendicular cut.

By blowing a gas onto the laser processing part, the neighborhood of the portion of the compound semiconductor layer being processed is cooled to reduce heat damage on the compound semiconductor layer. Furthermore, since a melt generated during the processing is blown away without being attached to the slant faces of the V-letter shape, a clean and sharp V-shaped groove can be obtained. Thus, division into individual chips is easy to perform. As the gas blown onto the laser processing part, any of oxygen, nitrogen, helium, argon, hydrogen, etc. can be used without any restriction. While helium, hydrogen and nitrogen can be cited as the gases particularly high in cooling effect, nitrogen cheap in cost is preferable. The smaller the diameter of the tip nozzle used for gas spraying, the better. This is because it is possible to perform local spraying and to accelerate the gas flow velocity.

The division into the individual devices may be otherwise accomplished by a mechanical means using a dicer. In this case, the individual devices may be prevented from sustaining chippings and cracks by properly selecting the blade to be used for cutting and minimizing the amount of insertion of the blade into the substrate to the fullest possible extent. While the amount of this insertion into the substrate may be arbitrarily selected in the range of 1 μm to 50 μm, it is preferably selected in the range of 1 μm to 20 μm and more preferably in the range of 1 μm to 10 μm. Subsequently, the regions of division are subjected to wet etching to form depressed parts (expanding slots). The wet etching is performed by the use of an orthophosphoric acid. The orthophosphoric acid is placed in a beaker which is contained in a prescribed heating device and heated therein to a temperature in the range of 100° C. to 400° C. If the heating temperature is unduly low, the etching speed will be lowered. If it is unduly high, the mask will sustain a pealing. By selecting this temperature preferably in the range of 150° C. to 300° C. and more preferably in the range of 180° C. to 240° C., it is made possible to reconcile the sufficient etching speed and the resistance of the mask.

The shape of the individual devices divided is formed advantageously into rectangles including squares and oblongs. Since a scriber for dividing a device is mechanically scanned, scanning in a straight line enables the scribing speed to be heightened. After the scribing in one direction is completed, scribing in the other direction is performed. The other direction is shifted by 90 degrees from the one direction if there is no particular reason. With this, square devices can be obtained.

The shape of the individual devices divided is formed also advantageously into hexagons. On the surface formed by the present invention a facet face equivalent to the (1-10-1) plane is easy to develop and has six equivalent planes. Therefore, the device is formed to have a hexagonal shape. When the sides of the hexagonal shape are caused to conform to the direction of the (1-100) plane, after formation of the tilted surfaces, the lateral sides of the device are formed of facet faces to enable the reflectivity to be enhanced.

To obtain a hexagonal device, not a scanning of a sample processing stage in a straight line is performed, but an X-Y axis scanning direction at a proper pitch may be instructed to a laser processing machine. Since the drive of the stage is performed under a computer control, it is easy to operate.

Now, the examples of this invention will be cited below.

EXAMPLE

A sapphire (Al$_2$O$_3$) C plane substrate was used as a substrate. On this substrate, an undoped GaN layer formed in a thickness of 6 μm, an n-type contact layer formed in a thickness of 4 μm by periodically doping Ge till an average carrier concentration of 1×10$^{19}$ cm$^{-3}$, an n clad layer formed of In$_{0.1}$Ga$_{0.9}$N in a thickness of 12.5 nm, a barrier layer formed of GaN in a thickness of 16 nm and a well layer formed of In$_{0.2}$Ga$_{0.8}$N in a thickness of 2.5 nm stacked alternately till a total of 5 cycles, a light-emitting layer of a multiple quantum well structure provided with a barrier layer, a p clad layer formed of In$_{0.07}$Ga$_{0.93}$N in a thickness of 10 nm and a p contact layer formed of Mg-doped (concentration of 8×10$^{19}$/cm$^3$) Al$_{0.03}$Ga$_{0.97}$N in a thickness of 0.15 μm were sequentially stacked through an AlN buffer in accordance with the procedure disclosed in JP-A 2003-243302 to form a nitride semiconductor layer on the substrate.

Figure 4:
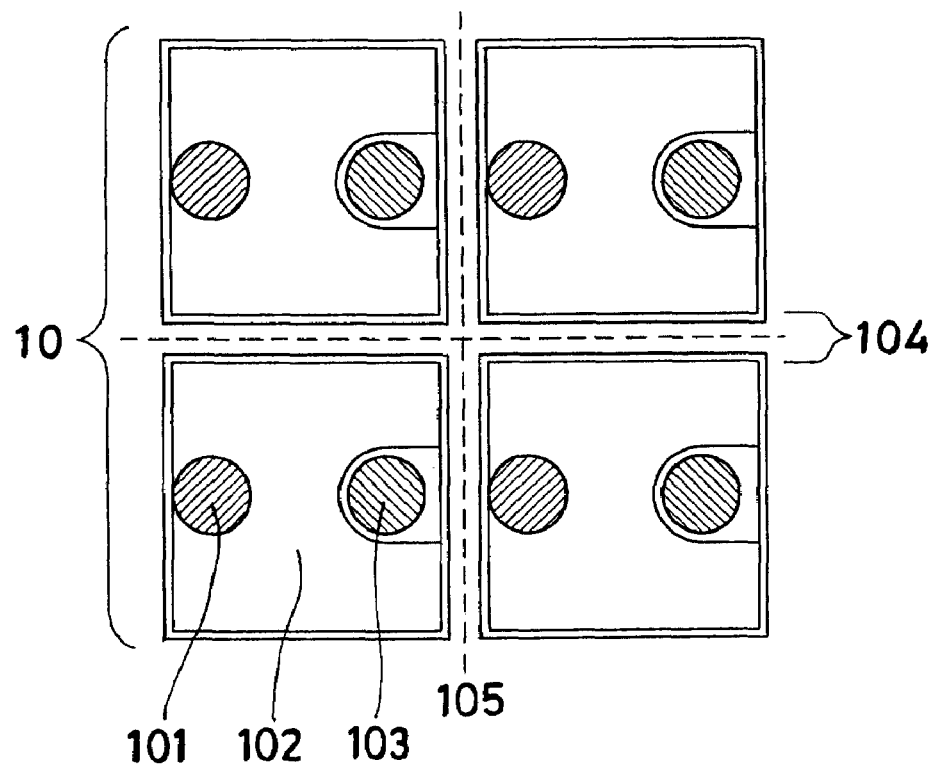
FIG. 4 is a plan view of a nitride semiconductor light-emitting diode fabricated in Example 1.

The surface of the nitride semiconductor layer was treated with the known lithography and RIE to expose part of the boundaries 104 of the individual devices and part of the n-type contact layers. At the prescribed position on the p contact layer of this compound semiconductor stacked layer, a transparent positive electrode 102 formed of Pt and Au in the order mentioned from the p contact layer side was produced by using the known lithography and lift-off process. Bonding pads were subsequently produced from the semiconductor side by using the known lithography and lift-off process. The photoresist used in the lithography was applied to the wafer of FIG. 4 in which the process of forming an electrode had been completed on the individual devices. By repeating the lithography, only the boundaries of the devices were exposed. In FIG. 4, reference numeral 10 denotes an aggregate of light-emitting diodes, numeral 101 a p-type pad, numeral 103 an n-type pad and numeral 105 a line for the removal of the nitride semiconductor layer.

A laser was used as means for removing the nitride semiconductor layer till the substrate. Grooves reaching a depth of 20 μm in the substrate were formed by using the laser with a wavelength of 266 nm, a frequency of 50 kHz, an output of 1.6 W and a operation speed of 70 mm/second. With the stage rotated by 90°, expanding slots were similarly formed in the Y axis direction. The substrate after forming the expanding slots therein was immersed for 20 minutes in a quartz beaker holding orthophosphoric acid heated to 240° C. by the use of a heating device to perform wet etching. The amount of the nitride semiconductor layer removed by this etching was 5.2 μm in depth. The substrate and the nitride semiconductor layer which had undergone the wet etching were rinsed in supersonic waves and further washed with an organic liquid to remove the etching mask formed of the resist.

The substrate and the nitride semiconductor layer which had undergone the etching treatment were further abraded on the substrate side till a decreased thickness of 80 μm. Thereafter, they were divided with a breaking device into the individual devices. When the separated devices were tested for output by the integrating sphere, the output was found to be 7.1 mW. When the lateral face of the device was observed by means of SEM, the lateral face of the nitride semiconductor layer was found to form a tilted angle θ of 130 degrees between the normal line relative to the lateral face of the nitride semiconductor layer and the normal line relative to the principal plane of the substrate as illustrated in FIG. 1.

COMPARATIVE EXAMPLE

An example which omitted a wet etching for the purpose of comparison is cited below. The growth of the nitride semiconductor layer and the removal of the nitride semiconductor layer were carried out under the same conditions as in Example 1. The wafer after forming the expanding slots therein were separated into the individual devices without performing any wet etching. The lateral faces of the divided devices were perpendicular to the principal plane of the substrate. When the separated devices were rated for output, the output was found to be 5.1 mW. The lateral face of the device was found to have substantially the same normal line as the lateral face of the perpendicularly broken substrate.

Since the nitride semiconductor light-emitting device of this invention sustains only insignificant damage during the work of forming expanding slots and exhibits a high light-extraction efficiency, it can be utilized as a light-emitting diode of high luminance.

What is claimed is:

1. A nitride semiconductor light-emitting device comprising a substrate and a nitride semiconductor layer including a light-emitting layer stacked on the substrate, wherein a first normal line relative to at least a lateral face of the nitride semiconductor layer between the substrate and the light-emitting layer and a second normal line relative to a lower surface of the nitride semiconductor layer intersect to form an angle θ larger than 90 degrees, wherein the lateral face of the nitride semiconductor layer is an external surface of the nitride semiconductor light-emitting device, the lateral face of the nitride semiconductor layer and a lateral side of the substrate form a discontinuous face, a principal plane of the substrate abuts the lower surface of the nitride semiconductor layer, the principal plane of the substrate and the lateral face of the nitride semiconductor layer form an acute angle, the substrate is formed from a material selected from the group consisting of sapphire and silicon carbide, and the lateral face of the nitride semiconductor layer excludes a lateral face of the light-emitting layer such that the lateral faces do not share a common normal line, the lateral faces being located on a same lateral side of the nitride semiconductor light-emitting device.

2. A nitride semiconductor light-emitting device according to claim 1, wherein the angle θ is 95 degrees or more and 170 degrees or less.

3. A nitride semiconductor light-emitting device according to claim 1, wherein the angle θ is 100 degrees or more and 160 degrees or less.

4. A nitride semiconductor light-emitting device according to claim 1, wherein the nitride semiconductor layer has a thickness in a range of 1 to 20 μm.

5. A nitride semiconductor light-emitting device according to claim 1, wherein the nitride semiconductor layer has a surface having a (0001) face as a principal face.

6. A nitride semiconductor light-emitting device according to claim 1, wherein the second normal line is normal relative to the principal plane of the substrate.

7. A nitride semiconductor light-emitting device according to claim 1, wherein the lateral face of the nitride semiconductor layer is tilted toward an outside relative to the principal plane of the substrate.

8. A nitride semiconductor light-emitting device according to claim 1, wherein the nitride semiconductor layer has a first lateral face and a second lateral face, and each of the first lateral face and the second lateral face have a normal line which intersects a normal line relative the surface of the nitride semiconductor layer to form an angle θ larger than 90 degrees.

9. A nitride semiconductor light-emitting device according to claim 8, wherein the first lateral face and the second lateral face of the nitride semiconductor layer are tilted toward an outside relative to the principal plane of the substrate.

10. A nitride semiconductor light-emitting device according to claim 1, wherein the light-emitting layer is disposed on a surface of the nitride semiconductor layer opposite to the surface of the nitride semiconductor layer which abuts the principal plane of the substrate.

11. A nitride semiconductor light-emitting device comprising a substrate and a nitride semiconductor layer including a light-emitting layer stacked on the substrate, wherein a first normal line relative to at least a lateral face of the nitride semiconductor layer between the substrate and the light-emitting layer and a second normal line relative to a lower surface of the nitride semiconductor layer intersect to form an angle θ larger than 90 degrees, wherein the lateral face of the nitride semiconductor layer is an external surface of the nitride semiconductor light-emitting device, the lateral face of the nitride semiconductor layer and a lateral side of the substrate form a discontinuous face, a principal plane of the substrate abuts the lower surface of the nitride semiconductor layer, the substrate is formed from a material selected from the group consisting of sapphire and silicon carbide, and the lateral face of the nitride semiconductor layer excludes a lateral face of the light-emitting layer such that the lateral faces do not share a common normal line, the lateral faces being located on a same lateral side of the nitride semiconductor light-emitting device, and the nitride semiconductor layer has an additional lateral face adjoining the lateral face of the light-emitting layer and the lateral face of the nitride semiconductor, the additional lateral face being perpendicular to the principal plane of the substrate, and the additional lateral face, the lateral face of the light-emitting layer and the lateral face of the nitride semiconductor layer are located on the same lateral side of the nitride semiconductor light-emitting device.

12. A nitride semiconductor light-emitting device according to claim 11, wherein the additional lateral face of the nitride semiconductor layer is between the lateral face of the light-emitting layer and the lateral face of the nitride semiconductor.

13. A nitride semiconductor light-emitting device according to claim 11, wherein the lateral face of the light-emitting layer is perpendicular to the principal plane of the substrate and the lateral face of the light-emitting layer forms a continuous face with the additional lateral face of the nitride semiconductor layer.

14. A nitride semiconductor light-emitting device according to claim 13, wherein the additional lateral face of the nitride semiconductor layer is between the lateral face of the light-emitting layer and the lateral face of the nitride semiconductor.

15. A method for the production of a nitride semiconductor light-emitting device comprising a substrate and a nitride semiconductor layer including a light-emitting layer stacked on the substrate, wherein a first normal line relative to at least a lateral face of the nitride semiconductor layer between the substrate and the light-emitting layer and a second normal line relative to a lower surface of the nitride semiconductor layer intersect to form an angle θ larger than 90 degrees, wherein the lateral face of the nitride semiconductor layer is an external surface of the nitride semiconductor light-emitting device, the lateral face of the nitride semiconductor layer and a lateral side of the substrate form a discontinuous face, a principal plane of the substrate abuts the lower surface of the nitride semiconductor layer, the principal plane of the substrate and the lateral face of the nitride semiconductor layer form an acute angle, the substrate is formed from a material selected from the group consisting of sapphire and silicon carbide, and the lateral face of the nitride semiconductor layer excludes a lateral face of the light-emitting layer such that the lateral faces do not share a common normal line, the lateral faces being located on a same lateral side of the nitride semiconductor light-emitting device, said method comprising the steps of covering a first surface of the nitride semiconductor layer with a mask provided with a prescribed pattern, removing the nitride semiconductor layer in regions to be divided into component devices, subjecting the nitride semiconductor layer to wet-etching treatment and dividing the nitride semiconductor layer into the component devices.

16. A method according to claim 15, wherein the mask is a photoresist.

17. A method according to claim 15, wherein the step of removing the nitride semiconductor layer is performed by means of a laser.

18. A method according to claim 15, wherein the step of removing the nitride semiconductor layer is performed by means of dry etching.

19. A method according to claim 10, wherein the step of removing the nitride semiconductor layer is performed by means of a dicer.

20. A method according to claim 15, wherein the wet etching treatment is performed by use of orthophosphoric acid.

* * * * *